US 11,335,534 B2

(12) United States Patent
Aso et al.

(10) Patent No.: US 11,335,534 B2
(45) Date of Patent: May 17, 2022

(54) PARTICLE BEAM IRRADIATION APPARATUS

(71) Applicant: HITACHI HIGH-TECH SCIENCE CORPORATION, Tokyo (JP)

(72) Inventors: Takuma Aso, Tokyo (JP); Xin Man, Tokyo (JP); Makoto Sato, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/027,341

(22) Filed: Sep. 21, 2020

(65) Prior Publication Data

US 2021/0090853 A1    Mar. 25, 2021

(30) Foreign Application Priority Data

Sep. 24, 2019    (JP) .............................. JP2019-173370

(51) Int. Cl.
*H01J 37/22*    (2006.01)
*H01J 37/244*    (2006.01)
*H01J 37/28*    (2006.01)
*H01J 37/30*    (2006.01)
*H01J 37/26*    (2006.01)

(52) U.S. Cl.
CPC .......... *H01J 37/222* (2013.01); *H01J 37/244* (2013.01); *H01J 37/265* (2013.01); *H01J 37/28* (2013.01); *H01J 37/3005* (2013.01)

(58) Field of Classification Search
CPC .. H01J 37/00; H01J 37/02; H01J 37/22; H01J 37/224; H01J 37/26; H01J 37/222; H01J 37/244; H01J 37/28; H01J 37/3005; H01J 37/265; H01J 2237/31749

USPC ................... 250/306, 307, 311, 492.1, 492.3
See application file for complete search history.

(56) References Cited

U.S. PATENT DOCUMENTS

| | | | |
|---|---|---|---|
| 2015/0212019 A1* | 7/2015 | Shishido | G01B 15/04 250/307 |
| 2019/0066971 A1* | 2/2019 | Nakazawa | G06T 5/50 |
| 2019/0362933 A1* | 11/2019 | Takagi | G01N 21/9501 |
| 2019/0385810 A1* | 12/2019 | Sato | H01J 37/244 |

FOREIGN PATENT DOCUMENTS

| | | |
|---|---|---|
| JP | 2011-086606 A | 4/2011 |
| JP | 2018-163822 A | 10/2018 |

* cited by examiner

*Primary Examiner* — Jason L McCormack
(74) *Attorney, Agent, or Firm* — Holland & Hart LLP

(57) ABSTRACT

The particle beam irradiation apparatus includes: an irradiation unit configured to radiate a particle beam; a first detection unit configured to detect first particles; a second detection unit configured to detect second particles; an image forming unit configured to form an observation image based on a first signal obtained by the detection of the first particles, which is performed by the first detection unit, and to form an observation image based on a second signal obtained by the detection of the second particles, which is performed by the second detection unit; and a control unit configured to calculate a brightness of a first region in the formed first observation image and perform a brightness adjustment of the first detection unit based on a first target brightness as a first brightness adjustment when the brightness of the first region is different from the first target brightness.

7 Claims, 7 Drawing Sheets

PARTICLE BEAM IRRADIATION APPARATUS

The present application claims priorities to Japanese Patent Application No. 2019-173370, filed Sep. 24, 2019, the entire contents of which is incorporated herein for all purposes by this reference.

BACKGROUND OF THE INVENTION

1. Field of the Invention

The present invention relates to a particle beam irradiation apparatus.

2. Description of the Related Art

Research and development have been conducted on a technology of a charged particle beam irradiation apparatus configured to irradiate a sample with a charged particle beam.

Regarding the technology of the charged particle beam irradiation apparatus, there is known a charged particle beam irradiation apparatus including an irradiation unit configured to radiate a charged particle beam within a predetermined irradiation region and a detection unit configured to detect charged particles generated from a sample, which is arranged so as to be located in the irradiation region, as a result of the irradiation of the sample with the charged particle beam. In the charged particle beam irradiation apparatus, an observation image of a desired observation region, which is included in the irradiation region, is formed based on a signal obtained by the detection of the charged particles, which is performed by the detection unit (see Japanese Patent Application Laid-open No. 2011-086606 and Japanese Patent Application Laid-open No. 2018-163822).

In the related-art charged particle beam irradiation apparatus described above, through a brightness adjustment of the detection unit (specifically, an adjustment of a voltage value associated with the brightness adjustment of the detection unit, such as an adjustment of a contrast value and a brightness value of the detection unit), the observation image having a desired brightness can be formed. However, when the charged particle beam irradiation apparatus includes a plurality of detectors, the brightness adjustment is individually performed for each of the plurality of detectors in the charged particle beam irradiation apparatus. Thus, the brightness adjustments require a long period of time.

SUMMARY OF THE INVENTION

The present invention has been made in view of the above-mentioned problem of the related art, and has an object to provide a particle beam irradiation apparatus, with which, even when observation is performed with use of a plurality of detectors, a period of time required for brightness adjustments of the plurality of detectors can be shortened.

According to at least one aspect of the present invention, there is provided a particle beam irradiation apparatus including: an irradiation unit configured to radiate a particle beam within a predetermined irradiation region; a first detection unit configured to detect first particles generated from a sample, which is arranged so as to be located in the predetermined irradiation region, as a result of irradiation of the sample with the particle beam; a second detection unit configured to detect second particles generated from the sample as a result of the irradiation of the sample with the particle beam; an image forming unit configured to form an observation image based on a first signal obtained by the detection of the first particles, which is performed by the first detection unit, and to form an observation image based on a second signal obtained by the detection of the second particles, which is performed by the second detection unit; and a control unit configured to acquire the observation image formed by the image forming unit as a first observation image, calculate a brightness of a first region in the acquired first observation image, and perform a brightness adjustment of the first detection unit based on a first target brightness as a first brightness adjustment when the brightness of the first region is different from the first target brightness, and to acquire the observation image formed by the image forming unit as a second observation image, calculate a brightness of a second region in the acquired second observation image, and perform a brightness adjustment of the second detection unit based on a second target brightness as a second brightness adjustment when the brightness of the second region is different from the second target brightness.

Further, according to another aspect of the present invention, in the particle beam irradiation apparatus, there may be used a configuration in which each of the first observation image and the second observation image is the observation image formed based on the first signal.

Further, according to another aspect of the present invention, in the particle beam irradiation apparatus, there may be used a configuration in which each of the first observation image and the second observation image is the observation image formed based on the second signal.

Further, according to another aspect of the present invention, in the particle beam irradiation apparatus, there may be used a configuration in which the first observation image is the observation image formed based on the first signal, and the second observation image is the observation image formed based on the second signal.

Further, according to another aspect of the present invention, in the particle beam irradiation apparatus, there may be used a configuration in which the control unit is configured to make the brightness of the first region closer to the first target brightness through the first brightness adjustment and to make the brightness of the second region closer to the second target brightness through the second brightness adjustment.

Further, according to another aspect of the present invention, in the particle beam irradiation apparatus, there may be used a configuration in which the first region is included in the first observation image, and includes a portion of the sample, which is a target desired to be observed, and the second region is included in the second observation image, and includes a mark serving as a reference in drift correction for correcting a position of the first region.

Further, according to another aspect of the present invention, in the particle beam irradiation apparatus, there may be used a configuration in which the particle beam irradiation apparatus further includes a display unit configured to display an image, and the control unit is configured to control the display unit to display at least one of the first observation image formed by the image forming unit after the first brightness adjustment or the second observation image formed by the image forming unit after the second brightness adjustment.

According to at least one aspect of the present invention, it is possible to provide the particle beam irradiation apparatus, with which, even when observation is performed with use of a plurality of detectors, a period of time required for brightness adjustments of the plurality of detectors can be shortened.

DESCRIPTION OF THE EMBODIMENT

Embodiments

Figure 1:
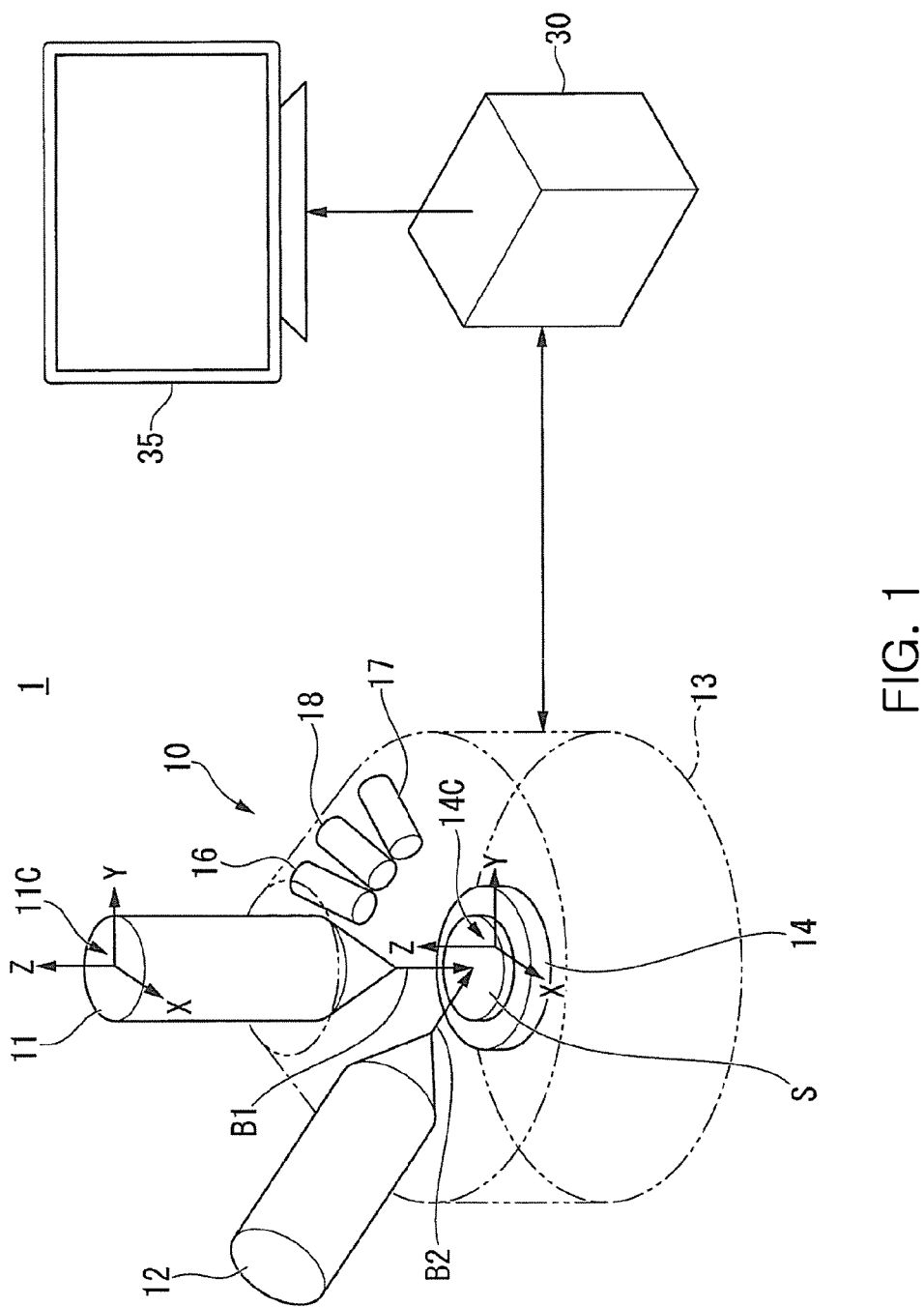
FIG. 1 is a view for illustrating an example of a configuration of a particle beam irradiation apparatus.

Now, at least one embodiment of the present invention is described with reference to the drawings.

<Outline of Particle Beam Irradiation Apparatus>

First, an outline of a particle beam irradiation apparatus according to at least one embodiment of the present invention is described.

The particle beam irradiation apparatus includes an irradiation unit, a first detection unit, a second detection unit, an image forming unit, and a control unit. The irradiation unit is, for example, a focused ion beam column, an electron beam column, or an argon beam column. The first detection unit is, for example, a first secondary electron detector, a second secondary electron detector, or a back scattering detector. The second detection unit is, for example, any of the first secondary electron detector, the second secondary electron detector, and the back scattering detector, which is different from the first detection unit. The irradiation unit is configured to radiate a particle beam (for example, a focused ion beam, an electron beam, or an argon beam) within a predetermined irradiation region. The first detection unit is configured to detect first particles (for example, secondary electrons) generated from a sample, which is arranged so as to be located in the predetermined irradiation region, as a result of the irradiation of the sample with the particle beam. The second detection unit is configured to detect second particles (for example, secondary electrons) generated from the sample, which is arranged so as to be located in the irradiation region, as a result of the irradiation of the sample with the particle beam. The image forming unit is configured to form an observation image (for example, a scanning electron microscope (SEM) image or a back scattering electron (BSE) image) based on a first signal obtained by the detection of the first particles, which is performed by the first detection unit, and to form an observation image (for example, any of the observation images including the SEM image and the BSE image, which is different from the observation image formed based on the first signal) based on a second signal obtained by the detection of the second particles, which is performed by the second detection unit. The control unit is configured to acquire the observation image formed by the image forming unit as a first observation image and calculate a brightness of a first region in the acquired first observation image. When the brightness of the first region is different from a first target brightness, the control unit performs a brightness adjustment of the first detection unit based on the first target brightness as a first brightness adjustment. Further, the control unit is configured to acquire the observation image formed by the image forming unit as a second observation image and calculate a brightness of a second region in the acquired second observation image. When the brightness of the second region is different from a second target brightness, the control unit performs a brightness adjustment of the second detection unit based on the second target brightness as a second brightness adjustment.

In this case, the brightness adjustment of the first detection unit corresponds to an adjustment of a voltage value associated with the brightness adjustment of the first detection unit, such as an adjustment of a contrast value and a brightness value of the first detection unit, so that the brightness of the first region becomes closer to the first target brightness. Through the brightness adjustment of the first detection unit, the image forming unit can form the first observation image having a brightness suitable for observation based on the first signal obtained by the detection of the first particles, which is performed by the first detection unit after the brightness adjustment thereof. Further, the brightness adjustment of the second detection unit corresponds to an adjustment of a voltage value associated with the brightness adjustment of the second detection unit, such as an adjustment of a contrast value and a brightness value of the second detection unit, so that the brightness of the second region becomes closer to the second target brightness. Through the brightness adjustment of the second detection unit, the image forming unit can form the second observation image having a brightness suitable for observation based on the second signal obtained by the detection of the second particles, which is performed by the second detection unit after the brightness adjustment thereof. As a result, even when the observation is performed with use of the plurality of detectors (that is, the first detection unit and the second detection unit, for example), the control unit can shorten a period of time required for brightness adjustments of the plurality of detectors.

In this case, each of the first observation image and the second observation image is, for example, the observation image formed based on the first signal. As another example, each of the first observation image and the second observation image is, for example, the observation image formed based on the second signal. As still another example, the first observation image is the observation image formed based on the first signal, and the second observation image is the observation image formed based on the second signal.

As an example, there is described below a case in which each of the first observation image and the second observation image is the observation image formed based on the first signal. Further, a configuration of the particle beam irradiation apparatus according to at least one embodiment of the present invention and processing performed by the particle beam irradiation apparatus are specifically described below. The particle beam radiated by the irradiation unit may be any of a charged particle beam, such as the focused ion beam formed by focusing ions or the electron beam formed by focusing electrons, and a neutral particle beam, such as the argon beam obtained by focusing argon particles. Further, the particle beam irradiation apparatus may include a plurality of irradiation units. In this case, the particle beam irradiation apparatus can radiate, for example, an appropriate combination of any two of the focused ion beam, the electron beam, and the neutral particle beam, or all of the focused ion beam, the electron beam, and the neutral particle beam. In the case described below, as an example, the particle beam is the charged particle beam.

<Configuration of Particle Beam Irradiation Apparatus>

Now, a particle beam irradiation apparatus 1 is described as an example of the particle beam irradiation apparatus according to at least one embodiment of the present invention. Further, a sample S is described below as an example of the sample in at least one embodiment of the present invention. The sample S is, for example, an electrically conductive sample. The sample S may be an insulating sample or a semi-electrically conductive sample (semiconductor sample) in place of the electrically conductive sample. Further, the sample S may also be a biological object, such as cells or a bone of an organism.

FIG. 1 is a view for illustrating an example of a configuration of the particle beam irradiation apparatus 1.

The particle beam irradiation apparatus 1 includes a particle microscope 10, a controller 30, and a display device 35. In the particle beam irradiation apparatus 1, part or all of the particle microscope 10, the controller 30, and the display device 35 may be integrally configured.

The particle microscope 10 includes, for example, a focused ion beam (FIB) column 11, an electron beam (EB) column 12, and a sample chamber 13. That is, the particle beam irradiation apparatus 1 is an example of a particle beam irradiation apparatus including two irradiation units, specifically, an irradiation unit configured to radiate the focused ion beam and an irradiation unit configured to radiate the electron beam. The particle beam irradiation apparatus 1 may include only any one of the focused ion beam column 11 and the electron beam column 12. Further, the particle beam irradiation apparatus 1 may include one or more columns each configured to radiate a beam formed by focusing another kind of particles (for example, the neutral particle beam) in place of any one or both of the focused ion beam column 11 and the electron beam column 12, or in addition to both of the focused ion beam column 11 and the electron beam column 12.

The focused ion beam column 11 is configured to radiate a focused ion beam B1 formed by focusing a predetermined kind of ions. The focused ion beam column 11 includes, for example, an ion source (for example, an ion gun), an ion acceleration unit, and an ion irradiation unit. The ion source is configured to generate ions. The ion acceleration unit is configured to apply an electric field to the ions generated by the ion source in an ion accelerating direction to accelerate the ions. The ion accelerating direction is a direction along a center axis of the focused ion beam column 11, and is a direction from the ion source of the focused ion beam column 11 toward an exit port of the focused ion beam column 11, through which the focused ion beam B1 is emitted. The ion irradiation unit includes an electrostatic lens. An electric field is applied by the electrostatic lens to the ions accelerated by the ion acceleration unit to focus the ions. Then, the ion irradiation unit radiates the focused ions as the focused ion beam B1 through the exit port to the irradiation region. The electrostatic lens may be of an acceleration type or a deceleration type. Further, the ion irradiation unit may include a magnetic field lens. In this case, a magnetic field is applied by the magnetic field lens to the ions accelerated by the ion acceleration unit to focus the ions.

The focused ion beam column 11 is accommodated in the sample chamber 13. A stage 14 and a stage driving unit are provided in the sample chamber 13. The stage 14 is a sample stage on which the sample S is to be placed. The stage driving unit is configured to change a position and a posture of the stage 14 in accordance with a request from the controller 30. In at least one embodiment, the position of the stage 14 is a position in a three-dimensional coordinate system 11C, and is represented by a position of an origin of a three-dimensional coordinate system 14C. Further, in at least one embodiment, the posture of the stage 14 is represented by directions of coordinate axes of the three-dimensional coordinate system 14C, which are directions with respect to coordinate axes of the three-dimensional coordinate system 11C. In this case, the three-dimensional coordinate system 11C is a three-dimensional Cartesian coordinate system associated with a predetermined position of the focused ion beam column 11. For example, the predetermined position may be a position of a center of gravity of the focused ion beam column 11. In FIG. 1, in order to avoid complication of the illustration, the position of the origin of the three-dimensional coordinate system 11C is shifted from the position of the center of gravity. The predetermined position may be another position associated with the focused ion beam column 11 in place of the position of the center of gravity of the focused ion beam column 11. The focused ion beam column 11 is fixed in the sample chamber 13 and is immovable. Thus, the position of the origin of the three-dimensional coordinate system 11C and the directions of the coordinate axes of the three-dimensional coordinate system 11C are fixed and immovable. The three-dimensional coordinate system 14C is a three-dimensional Cartesian coordinate system associated with a center of an upper surface of the stage 14. Thus, when the stage 14 is moved, the three-dimensional coordinate system 14C is moved together with the stage 14. In FIG. 1, in order to avoid complication of the illustration, the position of the origin of the three-dimensional coordinate system 14C is shifted from a position of the center of the upper surface of the stage 14.

In the example illustrated in FIG. 1, a Z-axis direction of the three-dimensional coordinate system 11C matches with a center-axis direction of the focused ion beam column 11. Further, in this example, an X-axis direction of the three-dimensional coordinate system 11C is a direction orthogonal to the Z-axis direction, and matches with a direction from the focused ion beam column 11 toward the electron beam column 12. Further, in this example, a Y-axis direction of the three-dimensional coordinate system 11C is a direction orthogonal to both of the X-axis direction and the Z-axis direction. Each of the X-axis direction, the Y-axis direction, and the Z-axis direction of the three-dimensional coordinate system 11C may match with another direction in place of a corresponding one of the above-mentioned directions.

When the position and the posture of the stage 14 match with a reference position and a reference posture, which are a position and a posture serving as predetermined references, the focused ion beam column 11 is installed at such a position that the center axis of the focused ion beam column 11 is orthogonal to the upper surface of the stage 14. In the case described below, for simplification of description, a user does not change the position and the posture of the stage 14 from the reference position and the reference posture.

In at least one embodiment, when the position and the posture of the stage 14 match with the reference position and the reference posture, the X-axis direction, the Y-axis direction, and the Z-axis direction of the three-dimensional coordinate system 14C match with the X-axis direction, the Y-axis direction, and the Z-axis direction of the three-dimensional coordinate system 11C, respectively. When the position and the posture of the stage 14 match with the reference position and the reference posture, the X-axis direction, the Y-axis direction, and the Z-axis direction of the three-dimensional coordinate system 14C may match with other directions in place of the X-axis direction, the Y-axis direction, and the Z-axis direction of the three-dimensional coordinate system 11C, respectively.

Further, the focused ion beam column 11 is installed at such a position as to allow the focused ion beam B1 to be radiated to the above-mentioned irradiation region. The irradiation region is a planar region set on a plane extending along the upper surface of the stage 14 when the position and the posture of the stage 14 match with the reference position and the reference posture. In the case described below, as an example, the irradiation region is set on an inner side of the upper surface of the stage 14 when the position and the posture of the stage 14 match with the reference position and the reference posture. In place of the above-mentioned region, a region set on a range including part of the upper surface or the entire upper surface of the stage 14 when the position and the posture of the stage 14 match with the reference position and the reference posture may be set as the irradiation region. Further, the irradiation region is always fixed. Thus, even when the stage driving unit changes the position and the posture of the stage 14, the irradiation region is not moved together with the upper surface of the stage 14. Specifically, the stage driving unit can translate or incline the sample S placed on the upper surface of the stage 14 relative to the irradiation region by changing the position and the posture of the stage 14. The focused ion beam column 11 is an example of the irradiation unit.

The electron beam column 12 is configured to radiate an electron beam B2 formed by focusing electrons. The electron beam column 12 includes, for example, an electron source (for example, an electron gun), an electron acceleration unit, and an electron irradiation unit. The electron source is configured to generate electrons. The electron acceleration unit is configured to apply an electric field to the electrons generated by the electron source in an electron accelerating direction to accelerate the electrons. The electron accelerating direction is a direction along a center axis of the electron beam column 12, and is a direction from the electron source of the electron beam column 12 toward an exit port of the electron beam column 12, through which the electron beam B2 is emitted. The electron irradiation unit includes an electrostatic lens. An electric field is applied by the electrostatic lens to the electrons accelerated by the electron acceleration unit to focus the electrons. Then, the electron irradiation unit radiates the focused electrons as the electron beam B2 through the exit port. The electrostatic lens may be of an acceleration type or a deceleration type. Further, the electron irradiation unit may include a magnetic field lens. In this case, a magnetic field is applied by the magnetic field lens to the electrons accelerated by the electron acceleration unit to focus the electrons.

The electron beam column 12 is accommodated in the sample chamber 13 together with the focused ion beam column 11. When the position and the posture of the stage 14 match with the reference position and the reference posture serving as the references, the electron beam column 12 is installed at such a position that the center axis of the electron beam column 12 is inclined by a predetermined angle with respect to the upper surface of the stage 14. Further, the electron beam column 12 is installed at such a position as to allow the electron beam B2 to be radiated to the above-mentioned irradiation region. It is desired that the electron beam column 12 be arranged so that the direction along the center axis of the electron beam column 12, specifically, the direction from the electron source of the electron beam column 12 toward the exit port of the electron beam column 12, through which the electron beam B2 is emitted, and the direction along the center axis of the focused ion beam column 11, specifically, the direction from the ion source of the focused ion beam column 11 toward the exit port of the focused ion beam column 11, through which the focused ion beam B1 is emitted, are orthogonal to each other. The electron beam column 12 is also an example of the irradiation unit.

Further, the particle microscope 10 further includes a first secondary electron detector 16, a second secondary electron detector 17, and a back scattering detector (BSD) 18.

The first secondary electron detector 16 is one of three detectors included in the particle microscope 10. The first secondary electron detector 16 is provided at a position different from a position at which the second secondary electron detector 17 is provided, and is configured to detect secondary electrons generated from the sample S when the sample S is irradiated with the focused ion beam B1. The secondary electrons are, for example, scattered electrons included in electrons generated from the sample S, which are scattered by the focused ion beam B1. Further, the first secondary electron detector 16 is configured to detect secondary electrons generated from the sample S when the sample S is irradiated with the electron beam B2. The secondary electrons are, for example, scattered electrons included in the electrons generated from the sample S, which are scattered by the electron beam B2. The first secondary electron detector 16 is configured to output a signal containing information indicating the detected secondary electrons to the controller 30. This information indicates the number of the secondary electrons.

The first secondary electron detector 16 is an example of the first detection unit, and is also an example of the second detection unit. When the first secondary electron detector 16 is an example of the first detection unit, the secondary electrons detected by the first secondary electron detector 16 are an example of the first particles. In this case, the signal output from the first secondary electron detector 16 is an example of the signal obtained by the detection of the first particles, which is performed by the first detection unit. Further, when the first secondary electron detector 16 is an example of the second detection unit, the secondary electrons are an example of the second particles. In this case, the signal output from the first secondary electron detector 16 is an example of the signal obtained by the detection of the second particles, which is performed by the second detection unit. Further, in FIG. 1, the first secondary electron detector 16 is provided inside the sample chamber 13. Instead, the first secondary electron detector 16 may be provided inside the electron beam column 12.

The second secondary electron detector 17 is one of the three detectors included in the particle microscope 10. The second secondary electron detector 17 is provided at a position different from a position at which the first secondary electron detector 16 is provided, and is configured to detect secondary electrons generated from the sample S when the sample S is irradiated with the focused ion beam B1. The secondary electrons are, for example, scattered electrons included in electrons generated from the sample S, which are scattered by the focused ion beam B1. Further, the second secondary electron detector 17 is configured to detect secondary electrons generated from the sample S when the sample S is irradiated with the electron beam B2. The secondary electrons are, for example, scattered electrons included in the electrons generated from the sample S, which are scattered by the electron beam B2. The second secondary electron detector 17 is configured to output a signal containing information indicating the detected secondary electrons to the controller 30. This information indicates the number of the secondary electrons.

The second secondary electron detector 17 is an example of the first detection unit, and is also an example of the second detection unit. When the second secondary electron detector 17 is an example of the first detection unit, the secondary electrons detected by the second secondary electron detector 17 are an example of the first particles. In this case, the signal output from the second secondary electron detector 17 is an example of the signal obtained by the detection of the first particles, which is performed by the first detection unit. Further, when the second secondary electron detector 17 is an example of the second detection unit, the secondary electrons are an example of the second particles. In this case, the signal output from the second secondary electron detector 17 is an example of the signal obtained by the detection of the second particles, which is performed by the second detection unit.

The back scattering detector 18 is one of the three detectors included in the particle microscope 10. When the focused ion beam B1 is radiated to the sample S, the back scattering detector 18 detects secondary electrons scattered backward (that is, reflected) from the sample S. The secondary electrons are, for example, scattered electrons included in the electrons generated from the sample S, which are scattered backward by the focused ion beam B1. Further, when the electron beam B2 is radiated to the sample S, the back scattering detector 18 detects secondary electrons scattered backward from the sample S. The secondary electrons are, for example, scattered electrons included in the electrons generated from the sample S, which are scattered backward by the electron beam B2. The back scattering detector 18 is configured to output a signal containing information indicating the detected secondary electrons to the controller 30. This information indicates the number of the secondary electrons.

The back scattering detector 18 is an example of the first detection unit, and is also an example of the second detection unit. When the back scattering detector 18 is an example of the first detection unit, the secondary electrons detected by the back scattering detector 18 are an example of the first particles. In this case, the signal output from the back scattering detector 18 is an example of the signal obtained by the detection of the first particles, which is performed by the first detection unit. Further, when the back scattering detector 18 is an example of the second detection unit, the secondary electrons are an example of the second particles. In this case, the signal output from the back scattering detector 18 is an example of the signal obtained by the detection of the second particles, which is performed by the second detection unit. Further, in the example of FIG. 1, the back scattering detector 18 is provided inside the sample chamber 13. Instead, the back scattering detector 18 may be provided inside the electron beam column 12.

As described above, the particle beam irradiation apparatus 1 is an example of the particle beam irradiation apparatus including three detection units. In the particle beam irradiation apparatus 1 having the configuration described above, the particle microscope 10 is connected to the controller 30 through a cable so as to be communicable therewith. As a result, each of the focused ion beam column 11, the electron beam column 12, the stage 14, the first secondary electron detector 16, the second secondary electron detector 17, and the back scattering detector 18, which are included in the particle microscope 10, performs an operation based on a control signal acquired from the controller 30. Wired communication through the cable is performed based on a standard such as Ethernet (trademark) or a universal serial bus (USB). Further, the particle microscope 10 may be connected to the controller 30 through wireless communication performed based on a communication standard such as Wi-Fi (trademark).

The particle microscope 10 may include only part of the first secondary electron detector 16, the second secondary electron detector 17, and the back scattering detector 18, which are described above. Further, the particle microscope 10 may include another detector capable of detecting the particles generated from the sample S irradiated with the particle beam in place of part or all of the first secondary electron detector 16, the second secondary electron detector 17, and the back scattering detector 18, or in addition to all of the first secondary electron detector 16, the second secondary electron detector 17, and the back scattering detector 18.

For convenience of the description, unless the focused ion beam column 11 and the electron beam column 12 are required to be distinguished from each other, the focused ion beam column 11 and the electron beam column 12 are collectively referred to as "beam columns" below. Further, for convenience of the description, unless the focused ion beam B1 and the electron beam B2 are required to be distinguished from each other, the focused ion beam B1 and the electron beam B2 are collectively referred to as "particle beams" below. Further, for convenience of the description, unless the first secondary electron detector 16, the second secondary electron detector 17, and the back scattering detector 18 are required to be distinguished from each other, the first secondary electron detector 16, the second secondary electron detector 17, and the back scattering detector 18 are collectively referred to as "detectors" below.

The controller 30 is, for example, an information processing device such as a desktop personal computer (PC), a laptop PC, or a workstation. The controller 30 may be another information processing device such as a tablet PC, a multifunctional mobile phone (smartphone), a personal data assistance (PDA) in place of the information processing devices described above.

The controller 30 is configured to control the particle microscope 10. More specifically, the controller 30 controls the particle microscope 10 based on a received observation condition to irradiate an observation region complying with the observation condition, which is included in the irradiation region, with the particle beam. Then, the controller 30 controls the detector to detect the particles generated from the sample S, which is irradiated with the particle beam, in the observation region. Then, the controller 30 forms an observation image of the observation region based on the signal containing information indicating the particles detected by the detector. The controller 30 outputs the formed observation image to the display device 35 so as to display the observation image on the display device 35.

In the case described above, as an example, the observation condition is information containing one piece of observation region information indicating an observation region (desired observation region) desired to be observed by a user, and one piece of beam column information indicating a beam column (desired beam column) desired to be used by the user. In this case, the observation region complying with a given observation condition is an observation region indicated by the observation region information contained in the observation condition. Further, in this case, the beam column complying with a given observation condition is a beam column indicated by the beam column information contained in the observation condition. The observation region may be any of part of the irradiation region and the entire irradiation region. When the controller 30 controls the particle microscope 10 based on a given observation condition, the controller 30 controls the beam column complying with the observation condition to irradiate the observation region complying with the observation condition with the particle beam. The observation condition may contain a plurality of pieces of observation region information, and may contain a plurality of pieces of beam column information.

In the case described below, as an example, the observation condition is information containing, for example, the observation region information indicating the desired observation region desired to be observed by the user, which is included in the irradiation region, the beam column information indicating the desired beam column desired to be used by the user, detector information indicating a desired detector desired to be used by the user, irradiation parameter information indicating irradiation parameters set for the beam column indicated by the beam column information, and detection parameter information indicating detection parameters set for the detector indicated by the detector information. Part or all of the beam column information, the detector information, the irradiation parameter information, and the detection parameter information are not required to be contained in the observation condition. Even in this case, the controller 30 receives one or more kinds of information of the above-mentioned four kinds of information, which are not contained in the observation condition, separately from the observation condition.

Further, when the user desires to use a plurality of detectors (desired detectors), the observation condition may contain a plurality of pieces of detector information. In this case, the observation condition contains pieces of detection parameter information, which are associated with the respective plurality of detectors. For example, when detector information D1 indicating the first secondary electron detector 16 and detector information D2 indicating the second secondary electron detector 17 are contained in the observation condition, the detection parameter information indicating the detection parameters set for the first secondary electron detector 16 indicated by the detector information D1 is contained in the observation condition as detection parameter information D3 associated with the detector information D1. At the same time, the detection parameter information indicating the detection parameters set for the second secondary electron detector 17 indicated by the detector information D2 is contained in the observation condition as detection parameter information D4 associated with the detector information D2.

In this case, the irradiation parameters set for the beam column indicated by the beam column information include, for example, an aligner, a beam shift, an OL value, a stigma value, an accelerating voltage, a beam current, a lens mode, a kind of holder, a material of the sample S, and the position of the stage 14 described above. In this case, the beam current is a beam current of the particle beam to be radiated by the beam column. Further, the lens mode is a value indicating an operation mode of an objective lens included in the electrostatic lens (or the magnetic field lens) provided in the beam column. Further, the kind of holder is a value indicating the kind of holder configured to hold the sample S when the sample S is placed on the upper surface of the stage 14 in this example. The irradiation parameters may include, for example, another set value in place of part or all of the set values described above, or in addition to all of the set values described above.

Further, the detection parameters set for the detector indicated by the detector information include, for example, a contrast value and a brightness value. However, the contrast value and the brightness value are detection parameters before a brightness adjustment is performed for the detector. Thus, the detection parameters set for the detector after the completion of the brightness adjustment of the detector are different from the detection parameters contained in the observation condition except for a case in which the detection parameters coincidentally match with each other. The detection parameters set for the detector indicated by the detector information may include, for example, another set value in place of any one or both of the contrast value and the brightness value, or in addition to both of the contrast value and the brightness value.

The controller 30 receives one or more observation conditions, and receives timing information indicating timing to radiate the particle beam, for each of the received observation conditions, based on the corresponding observation condition. In this manner, the particle beam irradiation apparatus 1 can perform, for example, work involving a complicated observation step in which the radiation of the particle beam and the formation of the observation image based on each of a plurality of observation conditions are combined. The complicated observation step is an observation step including three steps that are to be repeated until a predetermined end condition is satisfied. The three steps correspond to, for example, a step of specifying the desired observation region from the irradiation region in which the sample S is arranged, a step of etching the specified observation region, and a step of forming the observation image of the etched observation region. The timing information may be contained in the observation condition.

Further, when the controller 30 controls the beam column to radiate the particle beam based on the received observation condition (specifically, when the observation image of the observation region indicated by the observation region information contained in the observation condition is formed by an image forming unit 362), the controller 30 performs control to radiate the particle beam, acquires the observation image formed as a result of the radiation of the particle beam, and calculates a brightness of a desired adjustment target region of the acquired observation image. When the calculated brightness is different from a desired target brightness, a brightness adjustment for making the brightness closer to the target brightness based on the target brightness is performed for each of the detectors indicated by one or more pieces of detector information contained in the observation condition. In at least one embodiment, the brightness adjustment of a given detector corresponds to an adjustment of a voltage value associated with the brightness adjustment of the detector, for example, the adjustment of the contrast value and the brightness value of the detector. The controller 30 performs the brightness adjustment described above for each of the detectors indicated by the one or more pieces of detector information contained in the observation condition. Thus, the controller 30 receives, in advance, adjustment target region information indicating the adjustment target region of the observation image. Further, the controller 30 performs the brightness adjustment described above for each of the detectors indicated by the one or more pieces of detector information contained in the observation condition. Thus, the controller 30 receives, in advance, target brightness information indicating the target brightness determined in accordance with the adjustment target region of the observation image. Then, the controller 30 stores the received target brightness information in a volatile storage area of a storage unit 32 or a non-volatile storage area of the storage unit 32. The adjustment target region may be any of part of the observation image and the entire observation image. In the case described below, as an example, the adjustment target region is the entire observation image. In this case, the controller 30 may be configured to receive a different piece of the target brightness information for each of the detectors indicated by the one or more pieces of detector information contained in the observation condition, or may be configured to receive common target brightness information for all the detectors indicated by the one or more pieces of detector information contained in the observation condition. In the case described below, as an example, the controller 30 receives the common target brightness information for all the detectors indicated by the one or more pieces of detector information contained in the observation condition. Through the above-mentioned brightness adjustment of the detector, the particle beam irradiation apparatus 1 can easily form observation images of a plurality of observation regions as observation images each having a brightness suitable for observation. Any one or both of the adjustment target region information and the target brightness information may be contained in the observation condition described above. Further, the adjustment target region information may be received by the controller 30 as information associated with some other information (for example, the observation region information). Further, the target brightness information may be received by the controller 30 as information associated with some other information (for example, the observation region information).

The controller 30 can perform other processing, for example, processing of forming a deposition film configured to protect a surface of the sample S on the surface of the sample S with use of the particle microscope 10. However, description of details of other processing such as that described above is omitted in the at least one embodiment.

The display device 35 is, for example, a display including a liquid crystal display panel or an electroluminescence (EL) display panel. The display device 35 is configured to display various kinds of images acquired from the controller 30. The display device 35 is an example of a display unit.

<Hardware Configuration of Controller>

Figure 2:
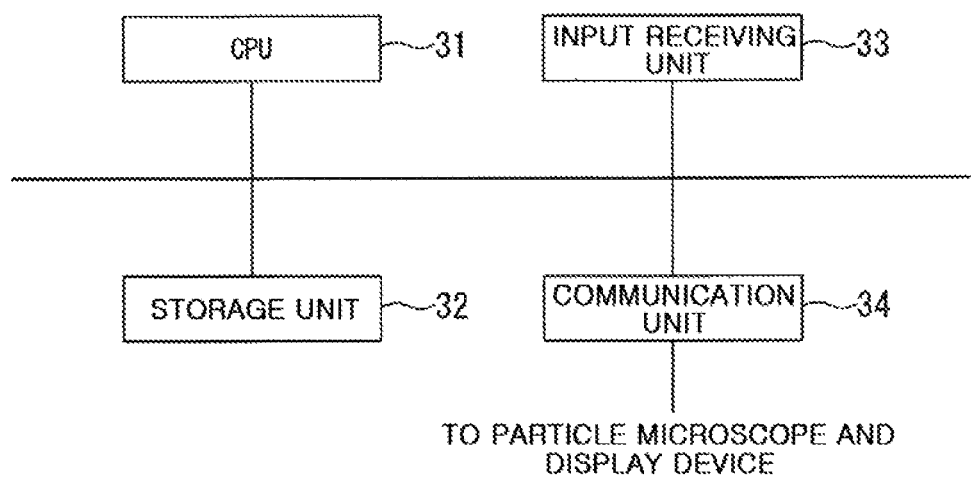
FIG. 2 is a diagram for illustrating an example of a hardware configuration of a controller.

Now, with reference to FIG. 2, a hardware configuration of the controller 30 is described. FIG. 2 is a diagram for illustrating an example of the hardware configuration of the controller 30.

The controller 30 includes, for example, a central processing unit (CPU) 31, the storage unit 32, an input receiving unit 33, and a communication unit 34. The above-mentioned components are connected via buses so as to be mutually communicable to/from each other. Further, the controller 30 communicates to/from each of the particle microscope 10 and the display device 35 via the communication unit 34.

The CPU 31 is configured to execute various kinds of programs stored in the storage unit 32.

The storage unit 32 includes, for example, a hard disk drive (HDD), a solid state drive (SSD), an electrically erasable programmable read only memory (EEPROM), a read only memory (ROM), and a random access memory (RAM). Specifically, the storage unit 32 includes a storage device having a volatile storage area and a storage device having a non-volatile storage area. The storage unit 32 may be, in place of the storage device built in the controller 30, an external type storage device connected through a digital input/output port, for example, a USB. The storage unit 32 is configured to store, for example, various kinds of information, various kinds of images, and various kinds of programs, which are to be processed by the controller 30.

The input receiving unit 33 is, for example, an input device such as a keyboard, a mouse, or a touchpad. When the controller 30 is configured integrally with the display device 35, the input receiving unit 33 may be another input device, for example, a touch panel, which is configured integrally with a display section included in the display device 35.

The communication unit 34 includes, for example, a digital input/output port such as a USB or an Ethernet (trademark) port.

<Functional Configuration of Controller>

Figure 3:
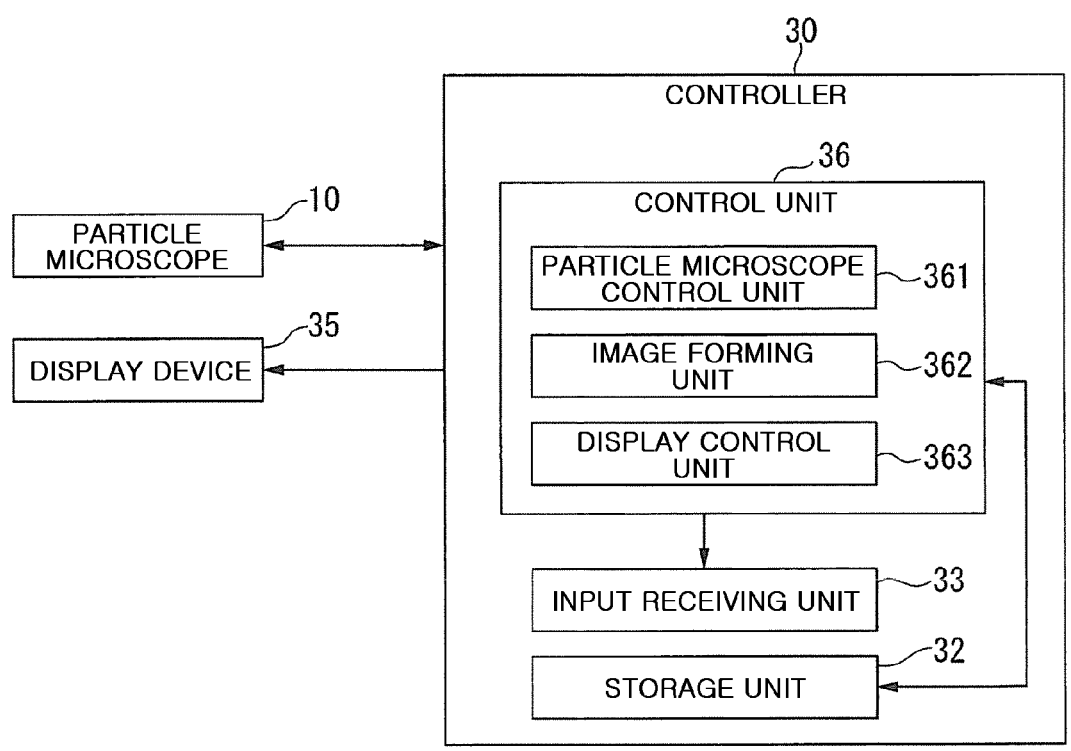
FIG. 3 is a diagram for illustrating an example of a functional configuration of the controller.

Now, with reference to FIG. 3, a functional configuration of the controller 30 is described. FIG. 3 is a diagram for illustrating an example of the functional configuration of the controller 30.

The controller 30 includes the storage unit 32, the input receiving unit 33, and a control unit 36.

The control unit 36 is configured to control the entire controller 30. The control unit 36 includes a particle microscope control unit 361, the image forming unit 362, and a display control unit 363. The above-mentioned functional units included in the control unit 36 are achieved by, for example, the CPU 31 executing the various kinds of programs stored in the storage unit 32. Further, part or all of the above-mentioned functional units may be hardware functional units such as a large-scale integration (LSI) circuit or an application-specific integrated circuit (ASIC).

The particle microscope control unit 361 is configured to control the entire particle microscope 10. The particle microscope control unit 361 controls, for example, the particle microscope 10 based on the received observation condition to etch the sample S. Further, the particle microscope control unit 361 controls, for example, the particle microscope 10 based on the received observation condition to radiate the particle beam to the observation region complying with the observation condition, which is included in the irradiation region. The particle microscope control unit 361 is an example of the control unit.

The image forming unit 362 is configured to form the observation image based on the signal acquired from each of the detectors included in the particle microscope 10.

The display control unit 363 is configured to create various kinds of screens to be displayed on the display device 35. The display control unit 363 is configured to output the created screen to the display device 35 to display the created screen on the display device 35.

<Processing of Performing Brightness Adjustment of Detector by Particle Beam Irradiation Apparatus>

Figure 4:
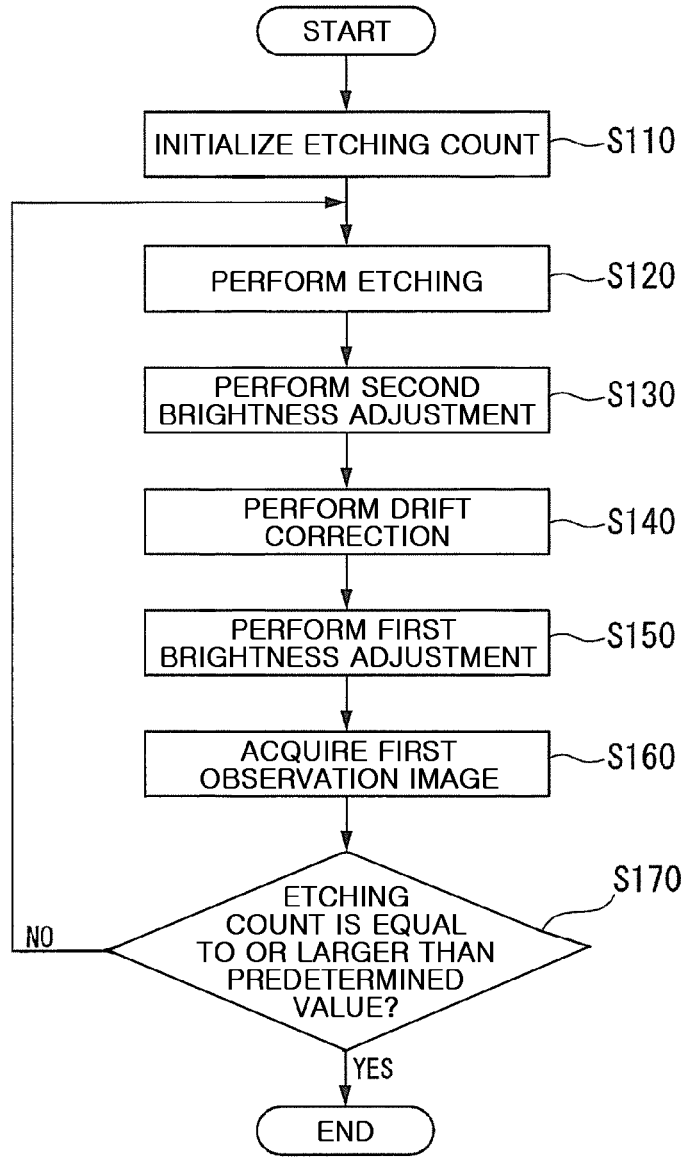
FIG. 4 is a flowchart for illustrating an example of a flow of processing of etching a sample in an observation region and forming an observation image of the observation region, which is performed by the particle beam irradiation apparatus.

Now, with reference to FIG. 4, processing of performing the brightness adjustment of the detector, which is performed by the particle beam irradiation apparatus 1, is described taking processing of etching the sample S in a given observation region R1 (not shown) and forming an observation image of the observation region R1, which is performed by the particle beam irradiation apparatus 1, as an example. FIG. 4 is a flowchart for illustrating an example of a flow of the processing of etching the sample S in the observation region R1 and forming the observation image of the observation region R1, which is performed by the particle beam irradiation apparatus 1. The observation region R1 is included in the irradiation region, and includes a portion of the sample S, which is a target desired to be observed.

In the processing illustrated in the flowchart of FIG. 4, the particle beam irradiation apparatus 1 repeatedly executes the etching of the sample S in the observation region R1, formation of the observation image of the observation region R1, and correction of a position of the observation region R1 through drift correction in order. Thus, as an example, there is described below a case in which the controller 30 receives three observation conditions, specifically, a first observation condition, a second observation condition, and a third observation condition, at timing before start of processing of Step S110 illustrated in FIG. 4.

The first observation condition is an observation condition associated with the etching of the sample S in the observation region R1. In this example, the first observation condition is information containing first observation region information, first beam column information, first detector information, first irradiation parameter information, and first detection parameter information. The first observation region information indicates the observation region R1. The first beam column information indicates the focused ion beam column 11. The first detector information indicates the first secondary electron detector 16. The first irradiation parameter information indicates the irradiation parameters set for the focused ion beam column 11. The first detection parameter information indicates the detection parameters set for the first secondary electron detector 16 when the etching is performed. That is, the first observation condition is an observation condition for allowing the particle microscope 10 to etch the sample S in the observation region R1 with use of the focused ion beam B1.

The second observation condition is an observation condition associated with the formation of the observation image of the observation region R1. In this example, the second observation condition is information containing the first observation region information, second beam column information, the first detector information, second irradiation parameter information, and second detection parameter information. The second beam column information indicates the electron beam column 12. The second irradiation parameter information indicates the irradiation parameters set for the electron beam column 12 when the observation image is formed. The second detection parameter information indicates the detection parameters set for the first secondary electron detector 16 when the observation image is formed. That is, the second observation condition is an observation condition for allowing the particle microscope 10 to radiate the electron beam B2 to the observation region R1 and detect the secondary electrons generated from the sample S in the observation region R1, which is irradiated with the electron beam B2, by the first secondary electron detector 16.

The third observation condition is an observation condition associated with the correction of the position of the observation region R1 through the drift correction. In this example, the third observation condition is information containing second observation region information, the second beam column information, the first detector information, third irradiation parameter information, and third detection parameter information. The second observation region information indicates an observation region R2. The third irradiation parameter information indicates the irradiation parameters set for the electron beam column 12 when the drift correction is performed. The third detection parameter information indicates the detection parameters set for the second secondary electron detector 17 when the drift correction is performed. That is, the third observation condition is an observation condition for allowing the particle microscope 10 to radiate the electron beam B2 to the observation region R2 and detect the secondary electrons generated from the sample S in the observation region R2, which is irradiated with the electron beam B2, by the second secondary electron detector 17. The observation region R2 is included in the irradiation region, and includes a mark serving as a reference in the drift correction for correcting the position of the observation region R1.

In this case, the observation region R2 may partially overlap with the observation region R1, and is not required to perfectly overlap with the observation region R1. Further, when, for example, the detector indicated by the detector information contained in the second observation condition and the detector indicated by the detector information contained in the third observation condition are different from each other, the observation region R2 may perfectly overlap with the observation region R1. The drift correction is a well-known technology, and hence a detailed description thereof is omitted.

Further, in the case described below, as an example, the controller 30 has already specified the position of the observation region R1 at the timing described above.

Further, in the case described below, as an example, the controller 30 receives first target brightness information indicating the first target brightness and second target brightness information indicating the second target brightness at timing before the start of the processing of Step S110 of FIG. 4.

The first target brightness is a target brightness for a brightness of the observation image to be formed as the first observation image by the image forming unit 362 based on the signal obtained by the detection of the particles generated from the observation region R1, which is performed by the first secondary electron detector 16. In other words, the first target brightness is a target brightness determined based on the first observation image as a brightness suitable for the observation of the observation region R1.

The second target brightness is a target brightness for a brightness of the observation image to be formed as the second observation image by the image forming unit 362 based on the signal obtained by the detection of the particles generated from the observation region R2, which is performed by the first secondary electron detector 16. In other words, the second target brightness is a target brightness determined based on the second observation image as a brightness suitable for the observation of the observation region R2. The second target brightness is different from the first target brightness except for a case in which the first target brightness and the second target brightness coincidentally match with each other. That is, even when the controller 30 receives information indicating the same brightness as the first target brightness as the second target brightness information, there arises no problem as a device.

In Step S110 illustrated in FIG. 4, the particle microscope control unit 361 generates and stores in the storage unit 32 a variable for storing an etching count corresponding to the number of times of etching processing performed in Step S120 described below. Then, the particle microscope control unit 361 initializes the variable generated and stored in the storage unit 32 to zero (Step S110). That is, the particle microscope control unit 361 initializes the etching count to zero. The particle microscope control unit 361 may be configured to initialize the variable to another numerical value different from zero. Further, the particle microscope control unit 361 may be configured to generate and store in the storage unit 32 a variable for storing, for example, a character string or a symbol, which represents the etching count, as the above-mentioned variable.

Next, the particle microscope control unit 361 controls the focused ion beam column 11 based on the first observation condition, which has been received in advance, to etch a part included in the observation region R1, of a surface of the sample S arranged so as to be located in the irradiation region (Step S120). Then, the particle microscope control unit 361 increments the value stored as the variable for storing the etching count, which is stored in the storage unit 32, by one. A method of etching the surface of the sample S in Step S120 may be any of a known method and a method that is developed in the future. Thus, description of details of the method of etching the surface in Step S120 is omitted.

Next, the particle microscope control unit 361 controls the particle microscope 10 based on second adjustment target region information, which has been received in advance, and the second target brightness information, which has been received in advance, to perform the brightness adjustment of the second secondary electron detector 17 as the second brightness adjustment (Step S130). Through the second brightness adjustment, the particle microscope control unit 361 makes a brightness of the second observation image closer to the second target brightness. In this example, a second adjustment target region being an adjustment target region of the second observation image is the entire region of the second observation image. Thus, the entire region of the second observation image is an example of the second region. In this case, the particle microscope control unit 361 reads out, for example, the second adjustment target region information and the second target brightness information, which are stored in the storage unit 32, and controls the particle microscope 10 based on the read-out second adjustment target region information and second target brightness information. Further, the particle microscope control unit 361 repeatedly performs the second brightness adjustment until it is determined that the brightness of the second adjustment target region (in this example, the brightness of the second observation image) matches with the second target brightness. More specifically, when, for example, a brightness of the second adjustment target region falls within a range of about ±5% of the second target brightness, the particle microscope control unit 361 determines that the brightness of the second adjustment target region matches with the second target brightness, and terminates the second brightness adjustment. The above-mentioned error range of about ±5% may be narrower than about ±5% or wider than about ±5%. Further, the method of performing the brightness adjustment of the second secondary electron detector 17 may be any of a known method and a method that is developed in the future. Thus, description of details of the method of performing the brightness adjustment of the second secondary electron detector 17 is omitted.

Next, the particle microscope control unit 361 controls the particle microscope 10 based on the third observation condition, which has been received in advance, to perform the drift correction (Step S140). At this time, the particle microscope control unit 361 controls the electron beam column 12 to radiate the electron beam B2 to the observation region R2, controls the image forming unit 362 to form the observation image (in this case, the SEM image) of the observation region R2, and acquires the observation image as the second observation image from the image forming unit 362. The second observation image is an observation image formed based on the signal obtained by the detection of the secondary electrons, which is performed by the second secondary electron detector 17, after the brightness adjustment is performed through processing of Step S130. Thus, the brightness of the second adjustment target region described above (in this example, the brightness of the second observation image) matches with the second target brightness. In other words, the second observation image is an observation image having a brightness suitable for the observation of the observation region R2. The particle microscope control unit 361 corrects the position of the observation region R1 based on the acquired second observation image.

Next, the particle microscope control unit 361 controls the particle microscope 10 based on first adjustment target region, which has been received in advance, and the first target brightness information, which has been received in advance, to perform the brightness adjustment of the first secondary electron detector 16 as the first brightness adjustment (Step S150). Through the first brightness adjustment, the particle microscope control unit 361 makes a brightness of the first observation image closer to the first target brightness. In this example, a first adjustment target region being an adjustment target region of the first observation image is the entire region of the first observation image. Thus, the entire region of the first observation image is an example of the first region. In this case, the particle microscope control unit 361 reads out, for example, the first adjustment target region information and the first target brightness information, which are stored in the storage unit 32, and controls the particle microscope 10 based on the read-out first adjustment target region information and first target brightness information. Further, the particle microscope control unit 361 repeatedly performs the first brightness adjustment until it is determined that the brightness of the first adjustment target region (in this example, the brightness of the first observation image) matches with the first target brightness. More specifically, when, for example, a brightness of the first adjustment target region falls within a range of about ±5% of the first target brightness, the particle microscope control unit 361 determines that the brightness of the first adjustment target region matches with the first target brightness, and terminates the first brightness adjustment. The above-mentioned error range of about ±5% may be narrower than about +5% or wider than about +5%. Further, the method of performing the brightness adjustment of the first secondary electron detector 16 may be any of a known method and a method that is developed in the future. Thus, description of details of the method of performing the brightness adjustment of the first secondary electron detector 16 is omitted.

Next, the particle microscope control unit 361 controls the electron beam column 12 based on the second observation condition, which has been received in advance, to radiate the electron beam B2 within the observation region R1 of the surface of the sample S arranged so as to be located in the irradiation region. The image forming unit 362 forms the observation image (in this case, the SEM image) of the observation region R1 based on the signal obtained by the detection of the secondary electrons generated from the sample S in the observation region R1 as a result of the irradiation of the electron beam B2, which is performed by the first secondary electron detector 16. The particle microscope control unit 361 acquires the observation image formed by the image forming unit 362 as the first observation image (Step S160). The first observation image is an observation image formed based on the signal obtained by the detection of the secondary electrons, which is performed by the first secondary electron detector 16, after the brightness adjustment is performed through the processing of Step S150. Thus, the brightness of the first adjustment target region (in this example, the brightness of the first observation image) matches with the first target brightness. In other words, the first observation image is an observation image having a brightness suitable for the observation of the observation region R1.

Next, the particle microscope control unit 361 determines whether or not the etching count stored in the variable for storing the etching count, which is stored in the storage unit 32, is equal to or larger than a predetermined value (Step S170). In this case, the predetermined value is a value determined based on a desired number of times of etching desired by the user to be performed on the sample S. The predetermined value is input by the user to the particle microscope control unit 361 in advance.

When the particle microscope control unit 361 determines that the etching count stored in the storage unit 32 is equal to or larger than the predetermined value (YES in Step S170), the particle microscope control unit 361 terminates the processing.

Meanwhile, when the particle microscope control unit 361 determines that the etching count stored in the storage unit 32 is smaller than the predetermined value (NO in Step S170), the processing returns to Step S120. In Step S120, the particle microscope control unit 361 controls the focused ion beam column 11 based on the position of the observation region R1, which has been corrected through the most recently performed processing of Step S140, and the first observation condition, which has been received in advance, to etch again a part included in the observation region R1, of the surface of the sample S arranged so as to be located in the irradiation region.

As described above, the particle beam irradiation apparatus 1 is configured to acquire the observation image formed by the image forming unit (in the above-mentioned example, the image forming unit 362) as the first observation image, calculate the brightness of the first region (in the above-mentioned example, the first adjustment target region) in the acquired first observation image, and perform the brightness adjustment of the first detection unit (in the above-mentioned example, the first secondary electron detector 16) based on the first target brightness as the first brightness adjustment when the brightness of the first region is different from the first target brightness. Further, the particle beam irradiation apparatus 1 is configured to acquire the observation image formed by the image forming unit 362 as the second observation image, calculate the brightness of the second region (in the above-mentioned example, the second adjustment target region) in the acquired second observation image, and perform the brightness adjustment of the second detection unit based on the second target brightness as the second brightness adjustment when the brightness of the second region is different from the second target brightness. With this configuration, even when the particle beam irradiation apparatus 1 performs observation with use of the plurality of detectors, a period of time required for the brightness adjustments of the plurality of detectors can be shortened. Further, the particle beam irradiation apparatus 1 can form each of the observation images of the plurality of observation regions as the observation image having the brightness suitable for the observation. As a result, the particle beam irradiation apparatus 1 can easily repeatedly acquire the first observation image having the brightness suitable for the observation while performing the drift correction with high accuracy in the processing of the flowchart of FIG. 4.

When the detector information indicating another detector (for example, the detector information indicating the second secondary electron detector 17) is contained in the second observation condition together with the detector information indicating the first secondary electron detector 16, the particle beam irradiation apparatus 1 performs the brightness adjustment of the first secondary electron detector 16 as the first brightness adjustment and the brightness adjustment of the another detector as a third brightness adjustment in Step S150. Further, in this case, the particle beam irradiation apparatus 1 performs the first brightness adjustment and the third brightness adjustment in parallel. When the particle beam irradiation apparatus 1 performs the third brightness adjustment together with the first brightness adjustment, the particle beam irradiation apparatus 1 performs the first brightness adjustment based on the first adjustment target region indicated by the first adjustment target region information, which has been received in advance, and the first target brightness indicated by the first target brightness information, which has been received in advance, and performs the third brightness adjustment based on a third adjustment target region indicated by third adjustment target region information, which has been received in advance, and a third target brightness indicated by third target brightness information, which has been received in advance. The third adjustment target region is a region to be a target of the brightness adjustment in the third brightness adjustment. The third target brightness is different from the first target brightness except for a case in which the third target brightness and the first target brightness coincidentally match with each other. As a result, when the particle beam irradiation apparatus 1 forms two different kinds of observation images (for example, the SEM image and the BSE image) in parallel with use of two detectors, a period of time required for the brightness adjustments of the two detectors can be shortened. In this case, the particle beam irradiation apparatus 1 may be configured to perform the first brightness adjustment and the third brightness adjustment in a predetermined order. In this case, the step in which the brightness adjustments of the two detectors are performed in parallel is not limited to Step S150, and may also be Step S130.

Further, when pieces of detector information, which indicate three or more detectors, are contained in one observation condition, the particle beam irradiation apparatus 1 may be configured to perform the brightness adjustments of the three or more detectors in parallel.

A change amount K1 in brightness of an observation image formed based on a signal obtained by detection of particles, which is performed by a detector DT1, generated when a voltage value V1 associated with a brightness adjustment of the detector DT1 is changed by a predetermined value and a change amount K2 in brightness of an observation image formed based on a signal obtained by detection of particles, which is performed by a detector DT2, generated when a voltage value V2 associated with a brightness adjustment of the detector DT2 is changed by a predetermined value, may be different from each other in some cases. When the change amount K1 and the change amount K2 are different from each other, a period of time required for the brightness adjustment of the detector DT1 based on a target brightness TK1 and a period of time required for the brightness adjustment of the detector DT2 based on another target brightness TK2 do not match with each other except for a case in which the above-mentioned periods of time coincidentally match with each other. Thus, in this case, even when the particle beam irradiation apparatus 1 performs the brightness adjustment of the detector DT1 and the brightness adjustment of the detector DT2 in parallel, it is difficult to shorten a period of time required for the above-mentioned two brightness adjustments. Thus, first proportion information indicating a proportional relationship between a change amount in voltage value V1 and the change amount K1 and second proportion information indicating a proportional relationship between a change amount in voltage value V2 and the change amount K2 may be stored in advance in the particle beam irradiation apparatus 1. In this case, the particle beam irradiation apparatus 1 can use the first proportion information and the second proportion information to change each of the voltage value V1 and the voltage value V2 so that the period of time required for the brightness adjustment of the detector DT1 based on the target brightness TK1 and the period of time required for the brightness adjustment of the detector DT2 based on the target brightness TK2 match with each other. The same configuration is employed even when the brightness adjustment is performed for each of three or more detectors in the particle beam irradiation apparatus 1. Further, a period of time required for the brightness adjustment of each of the detectors can also be shortened in the particle beam irradiation apparatus 1 by storing the above-mentioned proportional relationship information in advance.

When the observation image formed based on the signal obtained by the detection of the particles, which is performed by one detector, is the SEM image, a proportional relationship between a change amount in voltage value associated with the brightness adjustment of the detector and a change amount in brightness of the SEM image is different for each field of view of the detector. Thus, when the proportional relationship information indicating the proportional relationship is stored, it is desired that the particle beam irradiation apparatus 1 store the proportional relationship information for each field of view of the detector, or store information indicating a correction factor for correction between a proportional relationship indicated by the proportional relationship information at a field of view serving as a reference for the detector and a proportional relationship indicated by the proportional relationship information at another field of view.

The proportional relationship information described above may be any of a table in which the change amount in voltage value and the change amount in brightness are associated with each other, information indicating a constant of proportionality in the proportional relationship between the change amount in voltage value and the change amount in brightness, and other information indicating the proportional relationship.

<Processing of Receiving Observation Condition by Controller>

Figure 5:
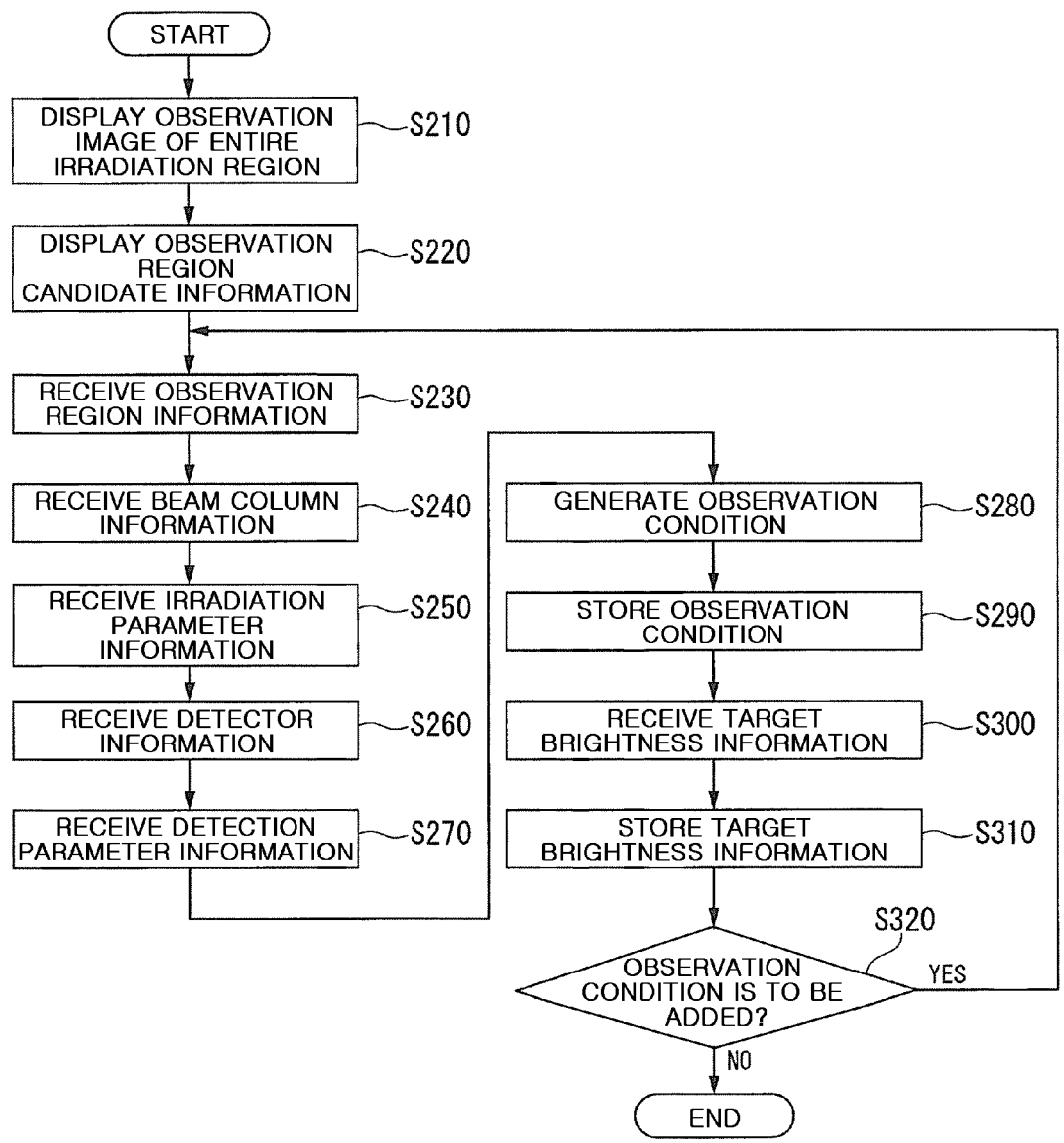
FIG. 5 is a flowchart for illustrating an example of a flow of processing of receiving an observation condition, which is performed by the controller.

Now, with reference to FIG. 5, processing of receiving the observation condition, which is performed by the controller 30, is described. FIG. 5 is a flowchart for illustrating an example of a flow of the processing of receiving the observation condition, which is performed by the controller 30.

As an example, there is described below a case in which the image forming unit 362 forms the SEM image of the entire irradiation region as the observation image of the entire irradiation region at timing before start of the processing of Step S210 of FIG. 5. Further, in the case described below, as an example, an operation of controlling the controller 30 to start receiving the observation condition is received by the controller 30 at the above-mentioned timing.

The display control unit 363 acquires the observation image of the entire irradiation region from the image forming unit 362. Then, the display control unit 363 generates an observation condition reception image including the acquired observation image. The observation condition reception image is an image through which the controller 30 receives the observation condition from the user. The display control unit 363 outputs the generated observation condition reception image to the display device 35 to display the observation condition reception image on the display device 35. That is, the display control unit 363 controls the display device 35 to display the observation image (Step S210). In this case, the observation image displayed on the observation condition reception image is the SEM image of the entire irradiation region. Thus, a position on the observation image corresponds to a position on the irradiation region on a one-to-one basis.

Next, the display control unit 363 specifies a region of the observation image, which is estimated as a desired observation region desired to be observed by the user, as a candidate of the observation region, based on the observation image acquired in Step S210. In this case, the display control unit 363 specifies, for example, a region of the observation image, which is estimated as a desired observation region desired to be observed by the user, based on a model of machine learning and the observation image, as a candidate of the observation region. As the model of machine learning, an image including a portion having a feature desired to be observed by the user (for example, a projection having a predetermined shape or an edge having a predetermined shape) is learned as a teacher image. The model of machine learning may be any of a neural network, deep learning, and a model of other machine learning. Further, the display control unit 363 may be configured to specify a region of the observation image, which is estimated as the desired observation region desired to be observed by the user, as the candidate of the observation region based on another algorithm such as pattern matching in place of the model of machine learning and the observation image. The display control unit 363 displays observation region candidate information indicating the specified candidate of the observation region on the observation image displayed on the observation condition reception image in an overlapped manner (Step S220). In this manner, the particle beam irradiation apparatus 1 enables reduction of time and effort of the user to search for the desired observation region based on the observation image. In Step S220, the display control unit 363 may be configured to display only one piece of observation region candidate information on the observation image in an overlapped manner, or may be configured to display a plurality of different pieces of observation region candidate information on the observation image in an overlapped manner.

Figure 6:
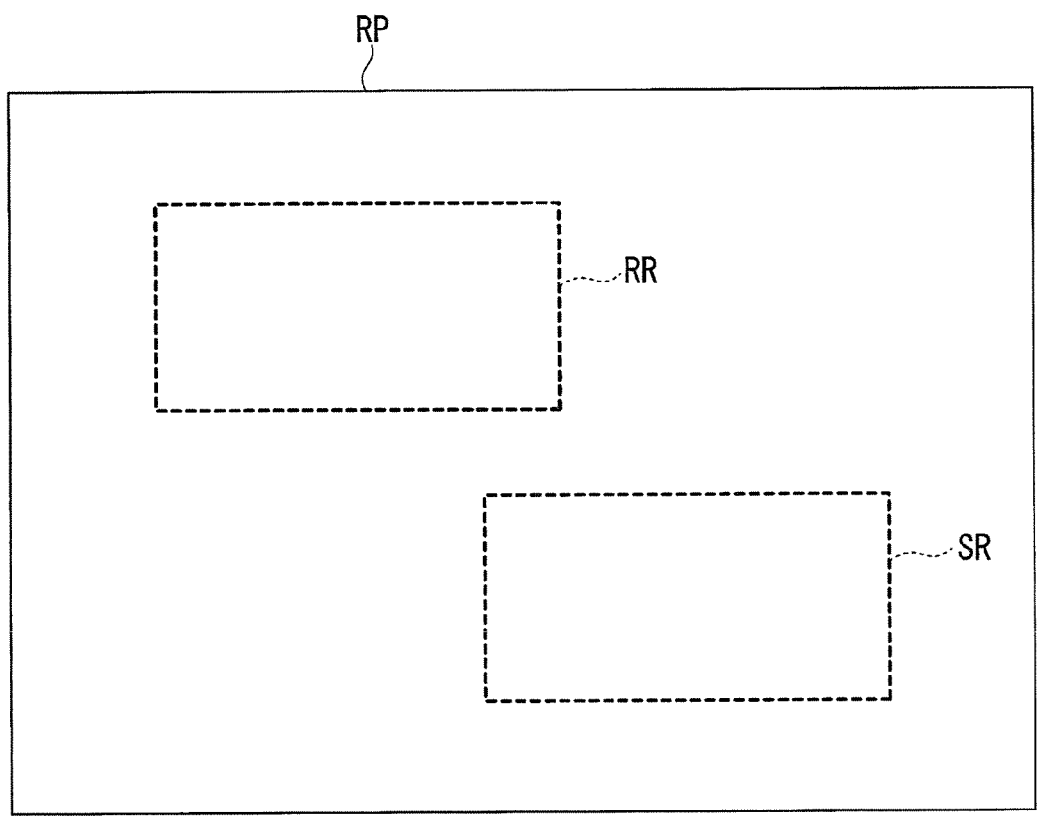
FIG. 6 is a diagram for illustrating an example of an observation image of the entire irradiation region, which is included in an image displayed on a display device.

FIG. 6 is a diagram for illustrating an example of the observation image of the entire irradiation region, which is included in the image displayed on the display device 35. An image RP illustrated in FIG. 6 is an example of the observation image. Information RR illustrated in FIG. 6 is an example of the observation region candidate information displayed by the display control unit 363 so as to be overlapped on the observation image.

After the processing of Step S220, the particle microscope control unit 361 receives the observation region information through the observation condition reception image (Step S230). More specifically, the particle microscope control unit 361 receives the observation region information indicating the desired observation region desired by the user based on an operation performed by the user for the observation condition reception image. For example, when the information RR is selected by the user on the image RP illustrated in FIG. 6, the particle microscope control unit 361 receives the observation region candidate information corresponding to the information RR as the observation region information indicating the observation region desired by the user. Further, for example, when a region different from the region indicated by the information RR is selected by the user on the image RP illustrated in FIG. 6, the particle microscope control unit 361 receives information indicating the selected region as the observation region information. A region SR illustrated in FIG. 6 is an example of the region selected by the user as described above. A method of allowing the user to select a region on the image RP may be any of a known method and a method that is developed in the future. Thus, description of details of the method of allowing the user to select a region on the image RP is omitted.

Next, the particle microscope control unit 361 receives, through the observation condition reception image, the beam column information indicating the beam column desired to be used by the user as the beam column configured to radiate the particle beam to the observation region indicated by the observation region information received in Step S230 (Step S240).

Next, the particle microscope control unit 361 receives, through the observation condition reception image, the irradiation parameter information on the beam column indicated by the beam column information received in Step S240 (Step S250).

Next, the particle microscope control unit 361 receives, through the observation condition reception image, the detector information indicating the detector desired to be used by the user for the detection of the particles generated from the sample S in the observation region indicated by the observation region information received in Step S230 (Step S260). In Step S260, when a plurality of the detectors are used, the particle microscope control unit 361 receives a plurality of pieces of detector information through the observation condition reception image.

Next, the particle microscope control unit 361 receives, through the observation condition reception image, the detection parameter information on the detector indicated by the detector information received in Step S260 (Step S270). In Step S270, when a plurality of the detectors are used, the particle microscope control unit 361 receives pieces of detection parameter information on the respective plurality of detectors.

In this case, the processing of Step S240 to Step S270 may be performed in an order different from the order of the flowchart of FIG. 5. Further, part or all of the processing may be performed in parallel. Further, part or all of the processing may be performed in parallel with the processing of Step S240.

After the processing of Step S270, the particle microscope control unit 361 generates the information containing the observation region information, the beam column information, the irradiation parameter information, the detector information, and the detection parameter information, which have been received in the processing of Step S230 to Step S270, as the observation condition (Step S280).

Next, the particle microscope control unit 361 stores the observation condition generated in Step S280 in the storage unit 32 (Step S290).

Next, the particle microscope control unit 361 receives, through the observation condition reception image, the target brightness information to be used when the brightness adjustment of the detector complying with the observation condition stored in the storage unit 32 in Step S290 is performed (Step S300).

Next, the particle microscope control unit 361 stores the target brightness information, which has been received in Step S300, in the storage unit 32 in association with the observation condition stored in Step S290 (Step S310). In this manner, the particle microscope control unit 361 can read out the target brightness information associated with the observation condition from the storage unit 32.

Next, the particle microscope control unit 361 determines whether or not a next observation condition is to be added (Step S320). In this case, when an operation of adding a next observation condition has been received from the user through the observation condition reception image, the particle microscope control unit 361 determines that a next observation condition is to be added. Meanwhile, when the operation described above has not been received from the user through the observation condition reception image, the particle microscope control unit 361 determines that a next observation condition is not to be added.

When the particle microscope control unit 361 determines that a next observation condition is not to be added (NO in Step S320), the particle microscope control unit 361 deletes the observation condition reception image displayed on the display device 35 and terminates the processing.

Meanwhile, when the particle microscope control unit 361 determines that a next observation condition is to be added (YES in Step S320), the processing returns to Step S230. In Step S230, the particle microscope control unit 361 receives again the observation region information indicating a next observation region.

The particle microscope control unit 361 may be configured to receive the first adjustment target region information and the second adjustment target region information, which have been described above, in advance through the same processing as that of Step S230 illustrated in FIG. 5, or may be configured to receive the first adjustment target region information and the second adjustment target region information in advance through other processing.

Further, the processing of Step S220 may be omitted from the flowchart of FIG. 5. Specifically, the display control unit 363 is not required to perform the estimation of the candidate of the observation region and the display of the observation region candidate information.

Further, the processing of Step S230 may be omitted from the flowchart of FIG. 5. Specifically, the particle microscope control unit 361 may be configured to receive the observation region candidate information indicating the candidate of the observation region, which is estimated by the display control unit 363 in Step S220, as the observation region information, without receiving the operation performed by the user.

Further, when receiving, for example, two or more pieces of observation region information, the particle beam irradiation apparatus 1 may receive part of the two or more pieces of observation region information from the observation region candidate information without the operation performed by the user, and receive all the remaining pieces of observation region information of the two or more pieces of the observation region information based on the operation performed by the user.

Further, when receiving, for example, two or more pieces of observation region information, the particle beam irradiation apparatus 1 may display the observation region candidate information at the time of reception of part of the two or more pieces of observation region information, and omit the display of the observation region candidate information at the time of reception of all the remaining pieces of observation region information of the two or more pieces of observation region information.

Further, the observation region information received by the particle microscope control unit 361 in the processing of Step S230 illustrated in FIG. 5 may be information indicating the entire irradiation region, specifically, information indicating the entire region of the image RP.

Modification Example of Embodiments

Figure 7:
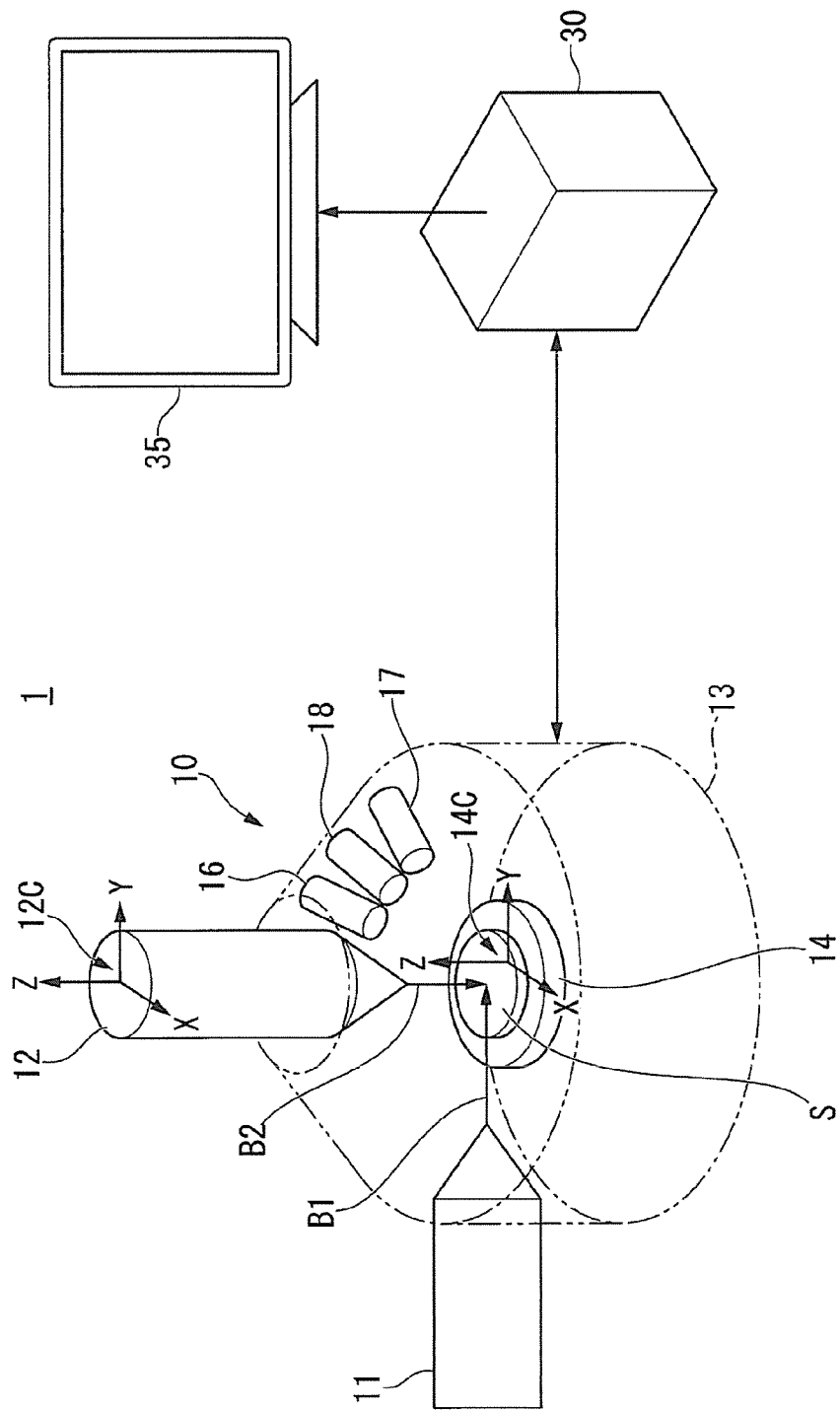
FIG. 7 is a diagram for illustrating another example of the configuration of the particle beam irradiation apparatus.

In the example described above, the focused ion beam column 11 and the electron beam column 12 are arranged in the particle microscope 10 so that the irradiation axes thereof obliquely cross each other. However, as illustrated in FIG. 7, the focused ion beam column 11 and the electron beam column 12 may be arranged in the particle microscope 10 so that the irradiation axes thereof are orthogonal to each other. FIG. 7 is a view for illustrating another example of the configuration of the particle beam irradiation apparatus 1.

However, in the example of FIG. 7, the position of the stage 14 is a position in a three-dimensional coordinate system 12C, and is represented by a position of an origin of a three-dimensional coordinate system 14C. Further, in the example, the posture of the stage 14 is represented by directions of coordinate axes of the three-dimensional coordinate system 14C, which are directions with respect to coordinate axes of the three-dimensional coordinate system 12C. In this case, the three-dimensional coordinate system 12C is a three-dimensional Cartesian coordinate system associated with a predetermined position of the electron beam column 12. For example, the predetermined position may be a position of a center of gravity of the electron beam column 12. In FIG. 7, in order to avoid complication of the illustration, the position of the origin of the three-dimensional coordinate system 12C is shifted from the position of the center of gravity. The predetermined position may be another position associated with the electron beam column 12 in place of the position of the center of gravity of the electron beam column 12. The electron beam column 12 is fixed in the sample chamber 13 and is immovable. Thus, the position of the origin of the three-dimensional coordinate system 12C and the directions of the coordinate axes of the three-dimensional coordinate system 12C are fixed and immovable.

The particle beam irradiation apparatus 1 including the particle microscope 10 illustrated in FIG. 7 can perform the same processing as that described above with reference to FIG. 4 to FIG. 6. As a result, even when the particle beam irradiation apparatus 1 performs the observation with use of the plurality of detectors, a period of time required for the brightness adjustments of the plurality of detectors can be shortened.

As described above, the particle beam irradiation apparatus according to at least one embodiment of the present invention described above includes: an irradiation unit configured to radiate a particle beam within a predetermined irradiation region; a first detection unit configured to detect first particles generated from a sample, which is arranged so as to be located in the predetermined irradiation region, as a result of irradiation of the sample with the particle beam; a second detection unit configured to detect second particles generated from the sample as a result of the irradiation of the sample with the particle beam; an image forming unit configured to form an observation image based on a first signal obtained by the detection of the first particles, which is performed by the first detection unit, and to form an observation image based on a second signal obtained by the detection of the second particles, which is performed by the second detection unit; and a control unit configured to acquire the observation image formed by the image forming unit as a first observation image, calculate a brightness of a first region in the acquired first observation image, and perform a brightness adjustment of the first detection unit based on a first target brightness as a first brightness adjustment when the brightness of the first region is different from the first target brightness, and to acquire the observation image formed by the image forming unit as a second observation image, calculate a brightness of a second region in the acquired second observation image, and perform a brightness adjustment of the second detection unit based on a second target brightness as a second brightness adjustment when the brightness of the second region is different from the second target brightness. With this configuration, in the particle beam irradiation apparatus, even when observation is performed with use of a plurality of detectors, a period of time required for brightness adjustments of the plurality of detectors can be shortened.

Further, in the particle beam irradiation apparatus, there may be used a configuration in which each of the first observation image and the second observation image is the observation image formed based on the first signal.

Further, in the particle beam irradiation apparatus, there may be used a configuration in which each of the first observation image and the second observation image is the observation image formed based on the second signal.

Further, in the particle beam irradiation apparatus, there may be used a configuration in which the first observation image is the observation image formed based on the first signal, and the second observation image is the observation image formed based on the second signal.

Further, in the particle beam irradiation apparatus, there may be used a configuration in which the control unit is configured to make the brightness of the first region closer to the first target brightness through the first brightness adjustment and to make the brightness of the second region closer to the second target brightness through the second brightness adjustment.

Further, in the particle beam irradiation apparatus, there may be used a configuration in which the first region is included in the first observation image, and includes a portion of the sample, which is a target desired to be observed, and the second region is included in the second observation image, and includes a mark serving as a reference in drift correction for correcting a position of the first region.

Further, in the particle beam irradiation apparatus, there may be used a configuration in which the particle beam irradiation apparatus further includes a display unit configured to display an image, and the control unit is configured to control the display unit to display at least one of the first observation image formed by the image forming unit after the first brightness adjustment or the second observation image formed by the image forming unit after the second brightness adjustment.

At least one embodiment of the present invention has been described in detail with reference to the drawings. However, specific configurations of the present invention are not limited to those described in the at least one embodiment. For example, change, replacement, or deletion may be made thereto without departing from the gist of the present invention.

Further, a program for achieving a function of an appropriate configuration unit of the device (for example, the controller 30) described above may be recorded in a computer-readable recording medium so that the program is read by a computer system to be executed. In this case, the "computer system" includes an operating system (OS) and hardware including peripheral devices. Further, the "computer-readable recording medium" includes a portable medium such as a flexible disk, a magneto-optical disk, a ROM, or a compact disk (CD)-ROM, and a recording medium such as a hard disk drive built in the computer system. Further, the "computer-readable recording medium" includes a recording medium that holds a program for a given period of time, such as a volatile memory (RAM) provided in the computer system serving as a server or a client when a program is transmitted via a network such as the Internet or a communication line such as a telephone line.

The above-mentioned program may be transmitted from the computer system in which the program is stored in, for example, the storage device, to another computer system via a transmission medium or through a transmission wave in a transmission medium. In this case, the "transmission medium" configured to transmit a program corresponds to a medium having a function of transmitting information, for example, a network (communication network) such as the Internet or a communication line (communication wire) such as a telephone line.

Further, the above-mentioned program may be intended to achieve a part of the functions described above. Further, the above-mentioned program may enable the functions described above to be achieved when being combined with a program that is already recorded in a computer system, and may be what is called a differential file (differential program).

What is claimed is:

1. A particle beam irradiation apparatus, comprising:
   an irradiation unit configured to radiate a particle beam within a predetermined irradiation region;
   a first detection unit configured to detect first particles generated from a sample, which is arranged so as to be located in the predetermined irradiation region, as a result of irradiation of the sample with the particle beam;
   a second detection unit configured to detect second particles generated from the sample as a result of the irradiation of the sample with the particle beam;
   an image forming unit configured to form an observation image based on a first signal obtained by the detection of the first particles, which is performed by the first detection unit, and to form an observation image based on a second signal obtained by the detection of the second particles, which is performed by the second detection unit; and
   a control unit configured to acquire the observation images formed by the image forming unit as a first observation image and a second observation image, store the first observation image and the second observation image as an observation condition in a storage area of a storage unit, calculate a brightness of a first region in the stored first observation image, and perform a brightness adjustment of the first detection unit based on a first target brightness stored in the storage area of the storage unit as a first brightness adjustment when the brightness of the first region is different from the first target brightness, calculate a brightness of a second region in the stored second observation image, and perform a brightness adjustment of the second detection unit based on a second target brightness stored in the storage area of the storage unit as a second brightness adjustment when the brightness of the second region is different from the second target brightness,
   wherein the control unit is configured to conduct a drift correction using an observation image including the second region which is formed by a second image forming unit after the second brightness adjustment, and
   wherein the control unit is configured to acquire an observation image including the first region after conducting the drift correction, by the image forming unit after the first brightness adjustment.

2. The particle beam irradiation apparatus according to claim 1, wherein each of the first observation image and the second observation image is the observation image formed based on the first signal.

3. The particle beam irradiation apparatus according to claim 1, wherein each of the first observation image and the second observation image is the observation image formed based on the second signal.

4. The particle beam irradiation apparatus according to claim 1,
   wherein the first observation image is the observation image formed based on the first signal, and
   wherein the second observation image is the observation image formed based on the second signal.

5. The particle beam irradiation apparatus according to claim 1, wherein the control unit is configured to make the brightness of the first region closer to the first target brightness through the first brightness adjustment and to make the brightness of the second region closer to the second target brightness through the second brightness adjustment.

6. The particle beam irradiation apparatus according to claim 1,
   wherein the first region is included in the first observation image, and includes a portion of the sample, which is a target desired to be observed, and
   wherein the second region is included in the second observation image, and includes a mark serving as a reference in drift correction for correcting a position of the first region.

7. The particle beam irradiation apparatus according to claim 1, further comprising a display unit configured to display an image,
   wherein the control unit is configured to control the display unit to display at least one of the first observation image formed by the image forming unit after the first brightness adjustment or the second observation image formed by the image forming unit after the second brightness adjustment.

* * * * *